(12) United States Patent
Laber et al.

(10) Patent No.: US 8,797,043 B2
(45) Date of Patent: Aug. 5, 2014

(54) SYSTEM AND METHOD FOR DETECTION OF OPEN CONNECTIONS BETWEEN AN INTEGRATED CIRCUIT AND A MULTI-CELL BATTERY PACK

(75) Inventors: Edgardo Laber, Monte Sereno, CA (US); Anthony Allen, Campbell, CA (US); Carlos Martinez, Morgan Hill, CA (US)

(73) Assignee: Intersil Americas Inc., Milpitas, CA (US)

( * ) Notice: Subject to any disclaimer, the term of this patent is extended or adjusted under 35 U.S.C. 154(b) by 267 days.

(21) Appl. No.: 13/174,040

(22) Filed: Jun. 30, 2011

(65) Prior Publication Data

US 2012/0081128 A1 Apr. 5, 2012

Related U.S. Application Data

(60) Provisional application No. 61/389,571, filed on Oct. 4, 2010.

(51) Int. Cl.
*G01R 31/02* (2006.01)
*G01R 31/36* (2006.01)

(52) U.S. Cl.
CPC ................... *G01R 31/026* (2013.01); *G01R 31/3658* (2013.01)
USPC ............ 324/522; 324/433; 324/432; 429/149

(58) Field of Classification Search
CPC .... G01R 31/02; G01R 31/043; G01R 31/026; G01R 31/3658
USPC .......... 324/434, 500, 512, 522, 537; 320/134, 320/139, 141, 161; 429/61, 90, 91, 149
See application file for complete search history.

(56) References Cited

U.S. PATENT DOCUMENTS

| | | | |
|---|---|---|---|
| 4,528,458 A * | 7/1985 | Nelson et al. .................... 307/64 |
| 5,153,496 A | 10/1992 | LaForge | |
| 5,206,578 A | 4/1993 | Nor | |
| 5,250,908 A * | 10/1993 | Liu et al. ........................ 324/542 |
| 5,498,950 A | 3/1996 | Quwerkerk | |
| 6,157,164 A * | 12/2000 | Jaworski et al. .............. 320/116 |
| 6,590,412 B2 * | 7/2003 | Sunter ..................... 324/762.01 |
| 7,777,367 B2 * | 8/2010 | Choy et al. ...................... 307/60 |
| 8,163,411 B2 | 4/2012 | Mizoguchi et al. | |
| 8,264,200 B2 * | 9/2012 | Lum-Shue-Chan et al. .. 320/116 |
| 2004/0036446 A1* | 2/2004 | Iwashima ..................... 320/116 |
| 2005/0052159 A1 | 3/2005 | Moore et al. | |
| 2009/0130542 A1* | 5/2009 | Mizoguchi et al. ............. 429/61 |
| 2010/0013544 A1* | 1/2010 | Niederberger ................ 327/513 |
| 2010/0173183 A1 | 7/2010 | Kadirvel et al. | |
| 2010/0207582 A1* | 8/2010 | Wu et al. ........................ 320/134 |
| 2010/0207639 A1* | 8/2010 | Yamawaki .................... 324/537 |
| 2010/0209748 A1* | 8/2010 | Kudo et al. ...................... 429/91 |

* cited by examiner

*Primary Examiner* — Arleen M Vazquez
*Assistant Examiner* — Robert P Alejnikov, Jr.
(74) *Attorney, Agent, or Firm* — Fogg & Powers LLC

(57) ABSTRACT

An apparatus comprises an integrated circuit and an open connection detection circuit within the integrated circuit. The integrated circuit includes a plurality of inputs for connecting with a plurality of outputs of a multi-cell battery pack. The open connection detection circuit within the integrated circuit detects an open connection on at least one of the plurality of inputs from the multi-cell battery and generates a fault condition responsive thereto.

19 Claims, 3 Drawing Sheets

SYSTEM AND METHOD FOR DETECTION OF OPEN CONNECTIONS BETWEEN AN INTEGRATED CIRCUIT AND A MULTI-CELL BATTERY PACK

CROSS-REFERENCE TO RELATED APPLICATIONS

This application claims benefit to U.S. Provisional Application No. 61/389,571, entitled SYSTEM FOR DETECTION OF OPEN CONNECTIONS BETWEEN AN INTEGRATED CIRCUIT AND A MULTI-CELL BATTERY PACK, filed Oct. 4, 2010, which is incorporated herein by reference in its entirety.

BRIEF DESCRIPTION OF THE DRAWINGS

For a more complete understanding, reference is now made to the following description taken in conjunction with the accompanying Drawings in which.

DETAILED DESCRIPTION

Figure 1:
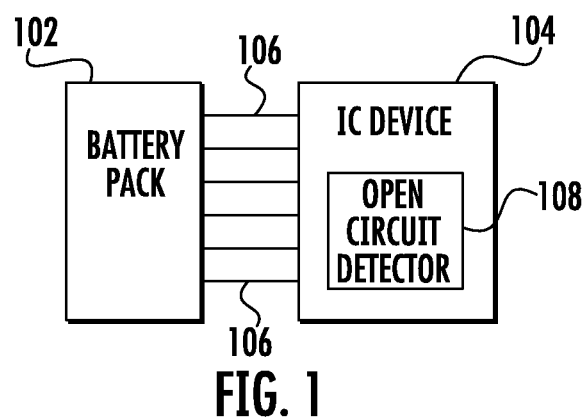
FIG. 1 is a block diagram of an integrated circuit device including open circuit detection circuitry.

Referring now to the drawings, wherein like reference numbers are used herein to designate like elements throughout, the various views and embodiments of a system and method for detection of open connections between an integrated circuit and a multi-cell battery pack are illustrated and described, and other possible embodiments are described. The figures are not necessarily drawn to scale, and in some instances the drawings have been exaggerated and/or simplified in places for illustrative purposes only. One of ordinary skill in the art will appreciate the many possible applications and variations based on the following examples of possible embodiments.

When an integrated circuit manages a multi-cell battery, there are multiple wireline connections between the multi-cell battery and the integrated circuit. The connections between the multi-cell battery and the integrated circuit may have a bad or open connection on the connecting wires at any particular point in time. There exists a need to be able to determine if an open circuit condition exists over any of these connections between the multi-cell battery and the integrated circuit. The ability to detect an open circuit condition between a multi-cell battery and an integrated circuit device is not presently available and this type of fault detection capability would provide a great benefit to a number of applications such as hybrid or fully electric automobiles.

Referring now to the drawings, and more particularly to FIG. 1, there is illustrated a functional block diagram of a connected multi-cell battery pack 102 and integrated circuit device 104. The multi-cell battery pack 102 comprises a number of series connected cells that provide a plurality of wire connections 106 between the multi-cell battery pack 102 and the IC device 104 from each connecting node of the cells.

In order to provide a fault detection capability of an open circuit condition, open circuit detection circuitry 108 is included within the IC device 104 to monitor each of the wireline connections 106 between the battery pack 102 and the IC device 104. The open circuit detection circuitry 108 monitors each of the wires 106 from the multi-cell battery pack 102 and upon detection of an open circuit condition generates a fault indication within the IC device 104. In this manner, the IC device 104 has the ability to monitor for bad connections with the multi-cell battery pack 102 in a quick and efficient manner.

Figure 2:
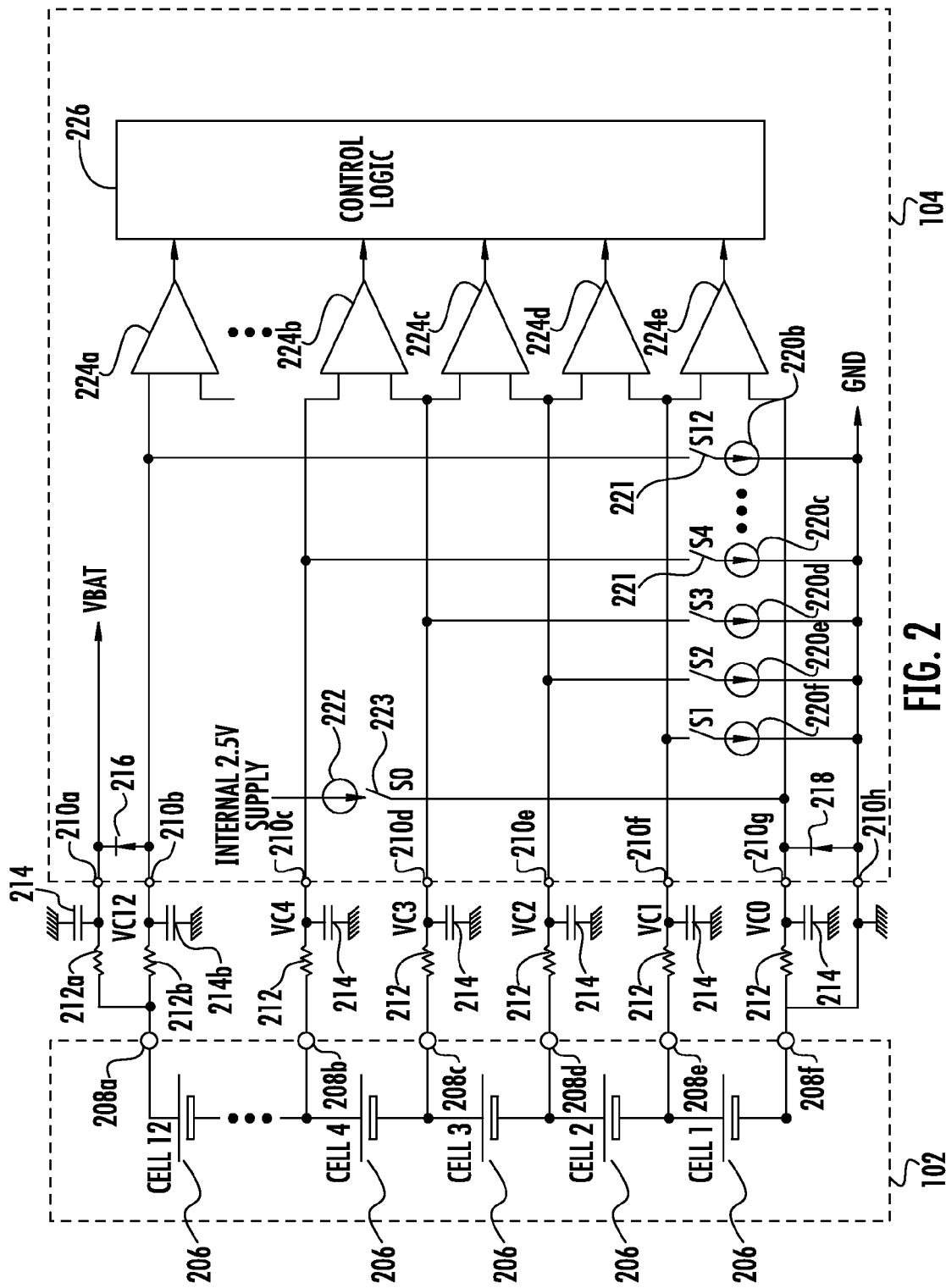
FIG. 2 is a schematic diagram of an open wire detection system for use with a multi-cell battery pack.

Referring now to FIG. 2, there is illustrated a schematic diagram of the integrated circuit including open circuit detection circuitry. The multi-cell battery 102 consists of a plurality of cells 206 that are connected together in series between a node 208a and the ground node 208f. In the example of FIG. 2, a twelve cell battery is illustrated however it should be realized that a multi-cell battery including any number of cells would also be applicable to the following description. The multi-cell battery 102 further includes a plurality of output nodes 208 for providing differing output voltages from each node within the series connection of battery cells 206. Each of the output nodes 208 are connected to an associated pin 210 of the integrated circuit 104. Connected between each of the output nodes 208 of the multi-cell battery 102 and each of the input pins 210 of the integrated circuit 104 is an optional RC circuit consisting of a resistor 212 having one side connected to an output node 208 and the other side connected to an input 210. A capacitor 214 is connected between an input pin 210 and ground. The RC circuit consisting of capacitor 214 and resistor 212 is not directly associated with the open wire detection system and may be omitted without affecting operation of the circuit.

In the example of FIG. 2, at node 208a, there are two RC circuits connected. The first RC circuit consists of resistor 212a and capacitor 214a connected to the rail voltage pin ($V_{BAT}$) 210a. Also connected to multi-cell battery output node 208a is a second RC circuit consisting of resistor 212b and capacitor 214b connected to input pin 210b. The remaining output pins of the multi-cell battery 102 have a single RC circuit connected thereto. In addition, the ground node 208f is also directly connected to ground. While the illustration described with respect to FIG. 2 includes each of the RC circuits implemented between the output nodes 208 of the multi-cell battery 102 and the input pins 210 of the IC circuit 104, in alternative embodiments, the RC circuitry could be implemented either within the IC 104, or within the multi-cell battery 102, or it may be omitted.

A diode 216 has its cathode connected to pin 210a at the rail voltage $V_{BAT}$. The anode of diode 216 is connected to pin 210b. A second diode 218 has its cathode connected to pin 210g while its anode is connected to the ground pin 210h. These diodes are used for detecting an open circuit on the rail voltage pin and ground voltage pin in the manner described herein below.

A plurality of current sources 220b through 220f are connected between one of the associated input pin nodes 210 of the integrated circuit 104 and a reference voltage such as ground. Thus, current source 220b is connected between input pin node 210b and ground, current source 220c is connected between input pin node 210c and ground and so forth. A switch 221 is connected between the input pin node and each of the current sources 220. This is used for turning on and off the current source 220 in order to determine an input voltage at each of the pins 210 as will be more fully described herein below. A current source 222 is connected between the internal 2.5 volt supply voltage and pin 210g. A switch 223 is used for turning on and off the current source 222.

Connected to each adjacent input pin 210 of the open circuit detection circuitry within the integrated circuit 104 are a series of comparators 224. Comparator 224a compares the voltage at the positive terminal of cell 12 and the negative terminal of cell 12. The comparator 224b compares the voltage from the positive terminal of cell 4 and the negative terminal of cell 4. The comparator 224c compares the voltage from the positive terminal of cell 3 with the voltage at the negative terminal of cell 3. Comparator 224b compares the voltage from the positive terminal of cell two with the voltage at the negative terminal of cell 2 and the comparator 224e compares the voltage at the positive terminal of cell 1 with the voltage at the negative terminal of cell 1. The outputs of the comparators 224 are provided to control logic 226 which determines whether an open condition exists between the multi-cell battery 102 and the integrated circuit 104 responsive to the output of comparators 224.

Within the circuit of FIG. 2, the open circuit detection circuitry 108 within the integrated circuit device 104 monitors each of the outputs from the multi-cell battery pack 102. The control logic 226 utilizes the output signals from the comparators 224 to determine if an open connection exists between the multi-cell battery pack 102 and the integrated circuit device 104. This is accomplished in the following manner. If a power connection is broken between the output node 208a of the multi-cell battery 102 and the input pin 210a of the integrated circuit device 104, the power supply current of the integrated circuit 104 is provided from pin 210b through diode 216. The control logic 226 detects the occurrence of a fault condition by determining that the diode 216 between pins 210a and 210b is forward biased Similarly, if the ground connection is broken between node 208f of the multi-cell battery 102 and the input pin 210h of the integrated circuit device 104, the ground current of the integrated circuit device 104 is returned to the negative terminal of the multi-cell battery pack 102 through diode 218 and is placed in the forward biased condition. The control logic 226 of the integrated circuit device detects the fault condition by measuring that the diode 218 between pins 210h and 210g is forward biased.

In order to detect a bad connection from any of pins 210g through 210b, the open detection circuitry of the integrated circuit device 104 applies a current at each of these pins using current sources 220b through 220f, respectively. These current sources 220 are turned on by closing the associated switch 221 associated with the current source 220. The current sources 220 may be turned on separately or at the same time. Detection coverage is higher if the current sources 220 are turned on separately as this allows two adjacent disconnected cells to be properly detected. The open circuit detection circuitry of the integrated circuit device senses if the voltages on adjacent pins change significantly enough to determine that there is a poor or open connection between the multi-cell battery pack 102 and the integrated circuit device 104. In the illustration of FIG. 2, the currents are applied to each pin 210 using current sources 220. Each of these current sources are turned on and off responsive to the switch 221 that is in series with the current source 220 such that the current source 220 may be turned on and off at different times. The comparators 224 monitor the voltages between adjacent pins and are used to determine significant voltage changes between the pins. It will be also appreciated by those with ordinary skill in the art that the function of the 224 comparators can be implemented by comparators already existing in a standard multi-cell battery monitoring system or integrated circuit.

For example, if the connection from pin 210d and node 208e is removed, when the current source 220d is turned on, the voltage at pin 210d will be lower than the voltage at pin 220e. This will be indicated by a change in the output of comparator 224c. Responsive to the change in the output of the comparator 224c, the control logic 226 generates a fault indication indicating the open circuit condition. An open circuit condition at any of the remaining current source 220b through 220g are detected in a similar manner to determine if an open condition exists at any point between the multi-cell battery 102 and the integrated circuit device 104.

Figure 3:
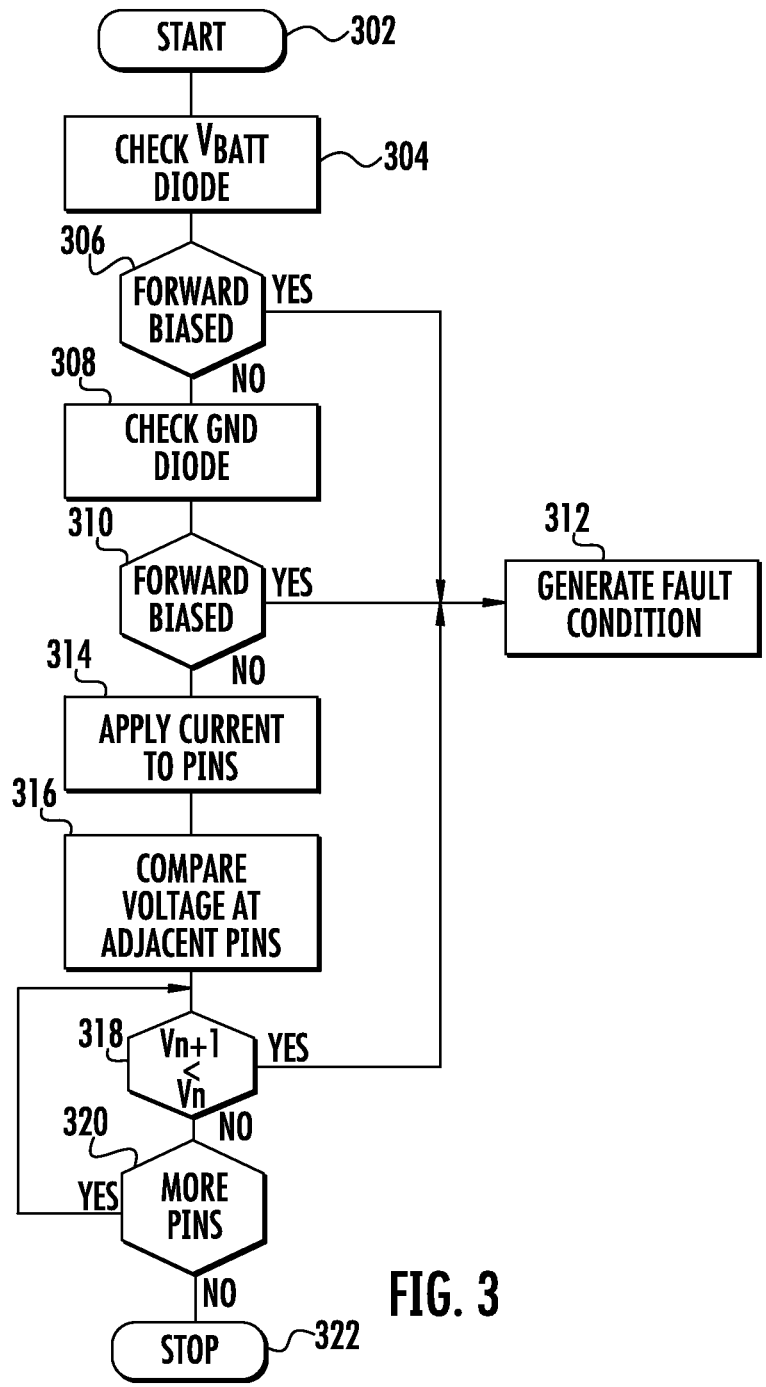
FIG. 3 if a flow diagram describing the operation of an open wire detection system with a multi-cell battery pack.

Referring now to FIG. 3, there is illustrated a flow diagram describing the operation of the circuit of FIG. 2. The flow diagram of FIG. 3 illustrates one of many possible sequences of operation of the system, but many others are possible. The process is initiated at step 302 and the diode 216 is checked at step 304 to determine if the diode is forward biased. If inquiry step 306 determines that the $V_{BAT}$ diode 216 is forward biased, a general fault condition is generated at step 312 by the control logic 226 indicating the open condition to the $V_{BAT}$ pin 210a. If inquiry step 306 does not detect a forward biased condition of the $V_{BAT}$ diode 216, the ground diode is checked at step 308 to determine if it is in a forward biased condition. Inquiry step 310 determines if a forward biased condition exists within the ground diode 218, and if so, the control logic 226 generates the general fault condition at step 312.

If the ground diode 218 is not in a forward biased condition, control passes to step 314 and a switch associated with a current source 220 is closed to apply a current to a pin 210 of the integrated circuit 104. The voltages of adjacent pins are compared by the comparators 224 at step 316. A determination is made at inquiry step 318 if the voltage at a first higher voltage pin is unexpectedly lower than a voltage at an adjacent pin connected to a lower output voltage pin. If so, the control logic generates a general fault condition at step 312 responsive to the comparator signal associated with the pair of comparator pins changing logical level. If inquiry step 318 determines that the higher voltage pin is not unexpectedly at a lower voltage, control passes to inquiry step 320 to determine if there are additional adjacent pairs of pins for comparison. If so, control passes back to step 318 to determine if the voltage of the higher voltage pin is unexpectedly lower than the voltage of the lower voltage pin. If inquiry step 320 determines that no further pins exist for comparison, the process is completed at step 322.

Using the above described circuitry, an integrated circuit device may include the ability to detect an open circuit condition between the integrated circuit device and the multiple outputs of a multi-cell battery pack. This is a feature that is not currently available within existing devices and provides a significant fault detection feature that is particularly important in, for example, automotive applications.

It will be appreciated by those skilled in the art having the benefit of this disclosure that this system and method for detection of open connections between an integrated circuit and a multi-cell battery pack provides an ability presently unavailable with a connection between an IC and a multi-cell battery. It should be understood that the drawings and detailed description herein are to be regarded in an illustrative rather than a restrictive manner, and are not intended to be limiting to the particular forms and examples disclosed. On the contrary, included are any further modifications, changes, rearrangements, substitutions, alternatives, design choices, and embodiments apparent to those of ordinary skill in the art, without departing from the spirit and scope hereof, as defined by the following claims. Thus, it is intended that the following claims be interpreted to embrace all such further modifications, changes, rearrangements, substitutions, alternatives, design choices, and embodiments.

What is claimed is:

1. An apparatus, comprising:
an integrated circuit including a plurality of inputs for connecting with a plurality of outputs of a multi-cell battery pack; and
an open connection detection circuit within the integrated circuit for detecting an open connection on at least one of the plurality of inputs connected to the multi-cell battery pack and generating a fault condition responsive thereto, the open connection detection circuit comprising:
a plurality of current source devices, each one of the plurality of current source devices respectively connected between one of the plurality of inputs connected to the multi-cell battery and a reference voltage; and
a plurality of switches, each of which is capable of turning on and off one of the plurality of current source devices, wherein each switch, when turned on, causes a current to flow through the input to which its respective current source device is connected.

2. The apparatus of claim 1, wherein the open connection detection circuit further comprises: at least one comparator for comparing voltages at adjacent inputs of the plurality of inputs and generating a control signal responsive thereto;
control logic for generating a fault detection indication responsive to the control signals indicating an open connection on at least one of the plurality of inputs.

3. The apparatus of claim 2, wherein an output of the at least one comparator generates the control signal that changes responsive to a voltage at a higher voltage node being lower than a second voltage at a lower voltage node or responsive to an abnormal voltage change.

4. The apparatus of claim 2, wherein the open connection detection circuit further comprises:
a first diode connected to a power connection pin of the integrated circuit; and
wherein when the first diode is in a forward biased condition indicating an open circuit on the power connection pin, the control logic generates the fault detection indication.

5. The apparatus of claim 2, wherein the open connection detection circuit further comprises:
a second diode connected to a ground connection pin of the integrated circuit; and
wherein when the second diode is in a forward biased condition indicating an open circuit on the ground pin, the control logic generates the fault detection indication.

6. The apparatus of claim 1, further including a plurality of RC circuits, each RC circuit connected to one of the plurality of pins of the multi-cell battery pack.

7. The apparatus of claim 6, further including the multi-cell battery pack having a plurality of outputs from a plurality of series connected battery cells, the multi-cell battery pack providing an output to each of the plurality of inputs of the integrated circuit.

8. An open connection detection circuit for detecting an open connection on at least one of a plurality of inputs from a multi-cell battery pack, comprising:
a plurality of current source devices, each one of the plurality of current source devices respectively connected between one of the plurality of inputs from the multi-cell battery and a reference voltage;
a plurality of switches, each of which is capable of turning on and off one of the plurality of current source devices, wherein each switch, when turned on, causes a current to flow through the input to which its respective current source device is connected;
at least one comparator for comparing voltages at adjacent inputs of the plurality of inputs and generating a control signal responsive thereto; and
control logic for generating a fault detection indication responsive to the control signals indicating an open connection on at least one of the plurality of inputs.

9. The open connection detection circuit of claim 8, wherein when an output of a comparator generates the control signal that changes responsive to a voltage at a higher voltage node being lower than a second voltage at a lower voltage node or responsive to an abnormal voltage change.

10. The open connection detection circuit of claim 8, wherein the open connection detection circuit further comprises:
a first diode connected to a power connection pin of the integrated circuit; and
wherein when the first diode is in a forward biased condition indicating an open circuit on the power connection pin, the control logic generates the fault detection indication.

11. The open connection detection circuit of claim 8, wherein the open connection detection circuit further comprises:
a second diode connected to a ground connection pin of the integrated circuit; and
wherein when the second diode is in a forward biased condition indicating an open circuit on the ground pin, the control logic generates the fault detection indication.

12. The open connection detection circuit of claim 8, further including a plurality of RC circuits, each RC circuit connected to one of the plurality of pins of the multi-cell battery pack.

13. The open connection detection circuit of claim 8, wherein the open connection detection circuit is implemented within an integrated circuit device.

14. A method for detecting an open connection between an integrated circuit device and a multi-cell battery, comprising the steps of:
monitoring each input in a plurality of inputs on the integrated circuit from the multi-cell battery pack;
detecting the open connection on at least one of the plurality of inputs from the multi-cell battery pack, wherein the step of detecting the open connection further comprises:
selectively activating at least one of a plurality of switches, each switch respectively associated with one of a plurality of current source devices, each of the plurality of current source devices respectively connected with one of the plurality of inputs from the multi-cell battery; and
applying a current through each of the plurality of inputs from the one of the plurality of current source devices; and
generating a fault condition responsive to the detected open connection within the integrated circuit device.

15. The method of claim 14, wherein the step of detecting further comprises the steps of:
comparing voltages at adjacent inputs of the plurality of inputs; and
generating a control signal responsive to the comparison.

16. The method of claim 15, wherein the step of generating the fault condition further comprises the step of generating a fault detection indication responsive to the control signals indicating an open connection on at least one of the plurality of inputs.

17. The method of claim 15, wherein the step of generating the control signal further comprises the step of generating the control signal that changes responsive to a voltage at a higher voltage node becoming lower than a second voltage at a previously lower voltage node or responsive to an abnormal voltage change.

18. The method of claim 14, wherein the step of generating the fault condition further comprising the steps of:

determining whether a first diode connected to a power connection pin of the integrated circuit device is operating in a forward biased condition indicating an open circuit on the power connection pin; and generating a fault detection indication responsive to a determination that the first diode is operating in the forward biased condition.

19. The method of claim 14, wherein the step of generating the fault condition further comprising the steps of:

determining whether a second diode connected to a ground connection pin of the integrated circuit device is operating in a forward biased condition indicating an open circuit on the ground connection pin; and generating a fault detection indication responsive to a determination that the second diode is operating in the forward biased condition.

\* \* \* \* \*